US011112472B2

United States Patent
Ruyters et al.

(10) Patent No.: US 11,112,472 B2
(45) Date of Patent: Sep. 7, 2021

(54) PRE-EMPHASIS TECHNIQUES BASED ON TEMPERATURE DEPENDENT GRADIENT SYSTEM BEHAVIOR FOR TRAJECTORY CORRECTION IN MAGNETIC RESONANCE IMAGING

(71) Applicants: Gudrun Ruyters, Erlangen (DE); Andrew Dewdney, Neunkirchen am Brand (DE); Manuel Stich, Parkstein (DE); Herbert Köstler, Retzbach (DE); Christiane Pfaff, Unterebersbach (DE); Tobias Wech, Würzburg (DE); Adrienne Campbell, Bethesda, MD (US)

(72) Inventors: Gudrun Ruyters, Erlangen (DE); Andrew Dewdney, Neunkirchen am Brand (DE); Manuel Stich, Parkstein (DE); Herbert Köstler, Retzbach (DE); Christiane Pfaff, Unterebersbach (DE); Tobias Wech, Würzburg (DE); Adrienne Campbell, Bethesda, MD (US)

(73) Assignees: Siemens Healthcare GmbH, Erlangen (DE); Julius-Maximilians-Universität Würzburg, Würzburg (DE); THE UNITED STATES OF AMERICA, as represented by the Secretary, Department of Health and Human Services, Bethesda, MD (US)

(*) Notice: Subject to any disclaimer, the term of this patent is extended or adjusted under 35 U.S.C. 154(b) by 63 days.

(21) Appl. No.: 16/699,415

(22) Filed: Nov. 29, 2019

(65) Prior Publication Data
US 2020/0333410 A1 Oct. 22, 2020

Related U.S. Application Data

(60) Provisional application No. 62/835,882, filed on Apr. 18, 2019.

(51) Int. Cl.
*G01R 33/385* (2006.01)
*G01R 33/565* (2006.01)

(52) U.S. Cl.
CPC ..... *G01R 33/3856* (2013.01); *G01R 33/3852* (2013.01); *G01R 33/56572* (2013.01)

(58) Field of Classification Search
USPC ........................................................ 324/309
See application file for complete search history.

(56) References Cited

U.S. PATENT DOCUMENTS 6,377,043 B1 * 4/2002 Aldefeld ............ G01R 33/3852
324/307
8,901,929 B2  12/2014 Biber et al.
(Continued)

FOREIGN PATENT DOCUMENTS

DE  102012210280 B4  8/2015

OTHER PUBLICATIONS

Addy NO, Wu HH, Nishimura DG. Simple method for MR gradientsystem characterization and k-space trajectory estimation. Magn Reson Med 2012;68: pp. 120-129.
(Continued)

*Primary Examiner* — Rodney E Fuller
(74) *Attorney, Agent, or Firm* — Lempia Summerfield Katz LLC

(57) ABSTRACT

A gradient system characterization function (e.g., a gradient system transfer function) may be developed by measuring a behavior of the MR device at a target temperature and developing at least one gradient system characterization function for a gradient coil of a magnetic resonance (MR) device at the target temperature based on the measured behavior. A patient may be subsequently imaged by the MR device, wherein the imaging process comprises measuring a temperature of a gradient coil, determining a gradient system
(Continued)

characterization function at the measured temperature, calculating a pre-emphasized gradient of the gradient coil, and imaging the patient using the pre-emphasized magnetic field component.

24 Claims, 7 Drawing Sheets

(56) References Cited

U.S. PATENT DOCUMENTS

| | | | |
|---|---|---|---|
| 2007/0159168 A1* | 7/2007 | Schneider | G01R 33/3815 |
| | | | 324/307 |
| 2013/0234708 A1* | 9/2013 | Goora | G01R 33/56572 |
| | | | 324/309 |
| 2013/0338488 A1 | 12/2013 | Dietz et al. | |
| 2014/0347054 A1 | 11/2014 | Kimmlingen et al. | |

OTHER PUBLICATIONS

Campbell-Washburn AE, Xue H, Ledermann RJ, et al. Real-time distortion correction of spiral and echo planar images using the gradient system impulse response function. Magn Reson Med 2016; 75: pp. 2278-2285.

Clayton DB, Elliott MA, Leigh JS, Lenkinski RE. 1H Spectroscopy without solvent suppression: characterization of signal modulations at short echo times. J Magn Reson 2001;153: pp. 203-209.

Dietrich BE, Nussbaum J, Wilm BJ, Reber J and Pruessmann KP. Thermal Variation and Temperature-Based Prediction of Gradient Response. In Proc Int Soc Magn Reson Med Sci Meet Exhib, 2017, p. 0079.

Duyn JH, Yang Y, Frank JA, van der Veen JW. Simple correction method for k-space trajectory deviations in MRI. J Magn Reson 1998;132: pp. 150-153.

Foerster BU, Tomasi D, Caparelli EC. Magnetic field shift due to mechanical vibration in functional magnetic resonance imaging. Magn Reson Med 2005;54: pp. 1261-1267.

Jehenson P, Westphal M, Schuff N. Analytical method for the compensation of eddy-current effects induced by pulsed magnetic field gradients in NMR systems. J Magn Reson 1990; 90: pp. 264-278.

Liebig P, Heidemann RM, Porter DA. Echo-planar imaging on a true zig-zag trajectory. In Proceedings of the 32nd Annual Scientific Meeting of the ESMRMB in Edinburgh, UK, Magnetic Resonance Materials, in Physics, Biology, and Medicine, vol. 28, Suppl. 1, Oct. 2015, S100-S101.

Liu H, Matson GB. Accurate measurement of magnetic resonance imaging gradient characteristics. Materials 2014; 7: pp. 1-15.

Nussbaum J, Wilm BJ, Dietrich BE, Pruessmann KP. Improved thermal modelling and prediction of gradient response using sensor placement guided by infrared photography. In Proc Int Soc Magn Reson Med Sci Meet Exhib, 2018, p. 4210.

Peters DC, Korosec FR, Grist TM, et al. Undersampled projection reconstruction applied to MR angiography. Mag Reson Med 2000; 43: pp. 91-101.

Stich M, Wech T, Slawig A, et al. Gradient waveform pre-emphasis based on the gradient system transfer function. Magn Reson Med 2018; 80: pp. 1521-1532.

Stich, Manuel, et al. "Implementation of a Gradient Pre-emphasis Based on the Gradient Impulse Response Function." 2017. pp. 1-5. http://indexsmart.mirasmart.com/ISMRM2017/PDFfiles/3909.html.

Vannesjo SJ, Haeberlin M, Kasper L, Pavan M, Wilm BJ, Barmet C, Pruessmann KP. Gradient system characterization by impulse response measurements with a dynamic field camera. Magn Reson Med 2013; 69: pp. 583-593.

Wech T, Tran-Gia J, Bley TA et al. Using self-consistency for an iterative trajectory adjustment (SCITA). Magn Reson Med. 2015; 73: pp. 1151-1157.

Wu YH, Chronik BA, Bowen C, Mechefske CK, Rutt BK. Gradient induced acoustic and magnetic field fluctuations in a 4 T wholebody MR imager. Magn Reson Med 2000; 44: pp. 532-536.

Liebig P, Heidemann RM, Porter DA. Echo-planar imaging on a true zig-zag trajectory. In Proceedings of the 32nd Annual Scientific Meeting of the ESMRMB in Edinburgh, UK, Magn Reson Mater Phy. Oct. 2015, S100-S101.

* cited by examiner

PRE-EMPHASIS TECHNIQUES BASED ON TEMPERATURE DEPENDENT GRADIENT SYSTEM BEHAVIOR FOR TRAJECTORY CORRECTION IN MAGNETIC RESONANCE IMAGING

The application claims the benefit of U.S. Provisional Patent Application No. 62/835,882, filed Apr. 18, 2019, which is hereby incorporated by reference in its entirety.

TECHNICAL FIELD

The disclosure relates to methods, devices, and systems for identifying temperature dependent deviations of a gradient waveform from an intended gradient waveform and k-space trajectory. The disclosure also relates to methods, devices, and systems for providing an appropriate temperature dependent pre-compensation at a time of imaging based on the understood temperature deviations of the gradient waveforms and k-space trajectories.

BACKGROUND

Magnetic resonance (MR) imaging is a known examination technique for generating images of the inside of a body of a patient and is based on the physical phenomenon of magnetic resonance. A magnetic resonance device includes a transmitting system, with which radio frequency (RF) electromagnetic excitation pulses, (also called RF pulses), may be generated which are irradiated into the patient during a magnetic resonance scan. U.S. Patent Application Publication No. 2014/0347054 A1, U.S. Pat. No. 8,901,929 B2, and German Patent No. DE 10 2012 210 280 B4 disclose, by way of example, various embodiments of a transmitting system.

From the RF irradiation, a magnetic alternating field results having a transmit frequency, which is also called the $B_1$ field. The irradiated excitation pulses are capable of deflecting nuclear spins in order to obtain a desired flip angle distribution for the respective examination. The deflected nuclear spins in turn emit MR signals, which are measured by the magnetic resonance device.

The transmitting system includes at least one RF antenna, which may also be called a RF transmitting antenna. The RF transmitting antenna is operated, for example, by at least one RF amplifier. The at least one RF amplifier transmits a transmission signal by a RF transmitting voltage to the RF transmitting antenna. The transmission signal has, for example, a sinusoidal shape having a particular transmit frequency, which is limited by an envelope, (e.g., a rectangular or Gaussian curve).

MR imaging applications such as cardiac imaging, functional imaging, and dynamic imaging benefit from the use of rapid acquisition methods involving time-varying gradients such as spiral imaging, interleaved echo-planar imaging (EPI) and 3D cones imaging. Such methods require the MR gradient system to operate at high gradient amplitudes and slew rates to rapidly sample k-space. However, k-space trajectories achieved on the scanner may deviate from their theoretical prescription. Without precise knowledge of the locations of sampled points in k-space, image reconstruction suffers. Unwanted deviations result in image artifacts such as ghosting, signal modulation, and geometric distortions.

In other words, k-space trajectory deviations may cause significant image artifacts, particularly for non-Cartesian trajectories. Non-Cartesian acquisitions such as radial or spiral trajectories or single shot EPI impose higher demands on the temporal accuracy of gradient fields. Possible reasons for deviations of the intended waveform from the gradient output include eddy currents, timing and amplifier errors and field fluctuations caused by mechanical vibrations after gradient switching, and thermal variation in hardware components. All these effects translate to deviations from the desired k-space trajectory or errors in the acquired signal and finally to artifacts in the image.

Adjusting or correcting for these deviations in k-space remains an on-going challenge in MR imaging.

BRIEF SUMMARY

The disclosure relates to methods, devices, and systems for identifying temperature dependent deviations of a gradient waveform from an intended gradient waveform and k-space trajectory. Gradient system characterization functions may be developed based on the identified temperature deviations. Additionally, pre-emphasis corrections of a gradient may be applied at a time of imaging based on the understood temperature deviations of the gradient waveforms and k-space trajectories. These processes, devices, and systems are advantageous in reducing in a number of artifacts when reconstructing the magnetic resonance image, particularly for non-Cartesian k-space trajectories, (e.g., spirals or EPI), and applications such as balanced steady-state free precession (bSSFP)-imaging or spatial spectral pulses where gradient pre-distortion is needed to obtain the nominal pulse form.

In one embodiment, a method is provided for developing at least one gradient system characterization function for a MR device. The method includes setting at least one gradient coil of the MR device at a target temperature; measuring a behavior of the MR device at the target temperature at different frequencies, wherein the different frequencies are generated by varying current through the at least one gradient coil; and developing, by a processor of the MR device, at least one gradient system characterization function for the at least one gradient coil of the MR device at the target temperature based on the measured behavior.

In another embodiment, a method is provided for imaging a patient using a MR device. The method includes measuring a temperature of at least one gradient coil of the MR device using at least one temperature sensor associated with the respective gradient coil; determining, using a processor of the MR device, a gradient system characterization function for the at least one gradient coil based on the measured temperature of the respective gradient coil; calculating a pre-emphasized gradient for the at least one gradient coil using the determined gradient system characterization function; and imaging the patient using the pre-emphasized gradient.

In another embodiment, a MR device is provided. The MR device includes a plurality of gradient coils (e.g., a first gradient coil for an x-axis, a second gradient coil for a y-axis, and a third gradient coil for a z-axis of the MR device). The MR device also includes at least one temperature sensor for each gradient coil of the plurality of gradient coils, the at least one temperature sensor configured to monitor a temperature of the respective gradient coil. The MR device further includes at least one processor configured to set the at least one gradient coil to a target temperature, measure a behavior (e.g., a strength of a received magnetic resonance signal or "signal strength") of the MR device for the at least one gradient coil at different frequencies generated by varying current through the at least one gradient coil and develop at least one characterization function for the at least one gradient coil at the target temperature based on the measured behavior. The MR device further includes a database or non-transitory memory configured to store the at least one characterization function of the at least one gradient coil of the plurality of coils. In certain examples, the MR device is further configured to image a patient using a pre-emphasized gradient developed from the characterization function of the gradient coil.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

Further advantages, features, and details of the disclosure emerge from the exemplary embodiments described below and with reference to the drawings. Mutually corresponding parts are provided with the same reference characters in all figures, in which.

DETAILED DESCRIPTION

Operation of a magnetic (MR) device or system includes the playing out of a gradient waveform with the gradient coils, which leads to the heating of the MR device over the course of the daily operation of the MR device. It has been discovered that the operating temperature of a gradient coil may affect deviations in k-space trajectory, which may lead to significant image artifacts in the imaging of the patient. In other words, repeated use the MR device throughout a day provides variability in the temperature of the gradient coils, which results in variability in how the MR device responds in imaging. Post-processing techniques may be used to adjust or provide certain corrections to these deviations after the imaging has been performed. Unfortunately, such post-processing techniques may not be eligible for certain applications such as special spectral pulses, bSSFP-imaging techniques where the nominal pulse form is needed, or phase contrast imaging.

The methods, devices, and systems disclosed herein provide an advantageous processing technique that is performed prior to the imaging of the patient. The processes disclosed herein advantageously are able to characterize how a MR device is actually performing, rather than using a post-processing technique to predict how the device should have performed. Specifically, by understanding the temperature of a gradient coil prior to imaging the patient, a pre-imaging adjustment may be made to improve the imaging process. A pre-emphasized gradient may be constructed to correct for deviations in k-space trajectory due to the operating conditions of the MR device (e.g., the operating temperature of a gradient coil at the time of imaging), and a patient may be imaged using the pre-emphasized gradient. These methods, devices, and systems advantageously provide a solution for the variability in the operating conditions (e.g., gradient coil temperature) at the time of imaging.

The process requires an understanding of the particular MR device or system being operated. The behavior or performance of the MR system may be studied at various temperatures. Gradient system characterization functions may be developed for certain target temperatures. These characterization functions may then be used when imaging a patient, wherein a correction is applied to adjust for a deviation in k-space trajectory based on the known temperature of the gradient coil(s) near the time of imaging and the known target temperature characterization functions developed for the MR system.

These methods, devices, and systems are described in greater detail below.

Figure 1:
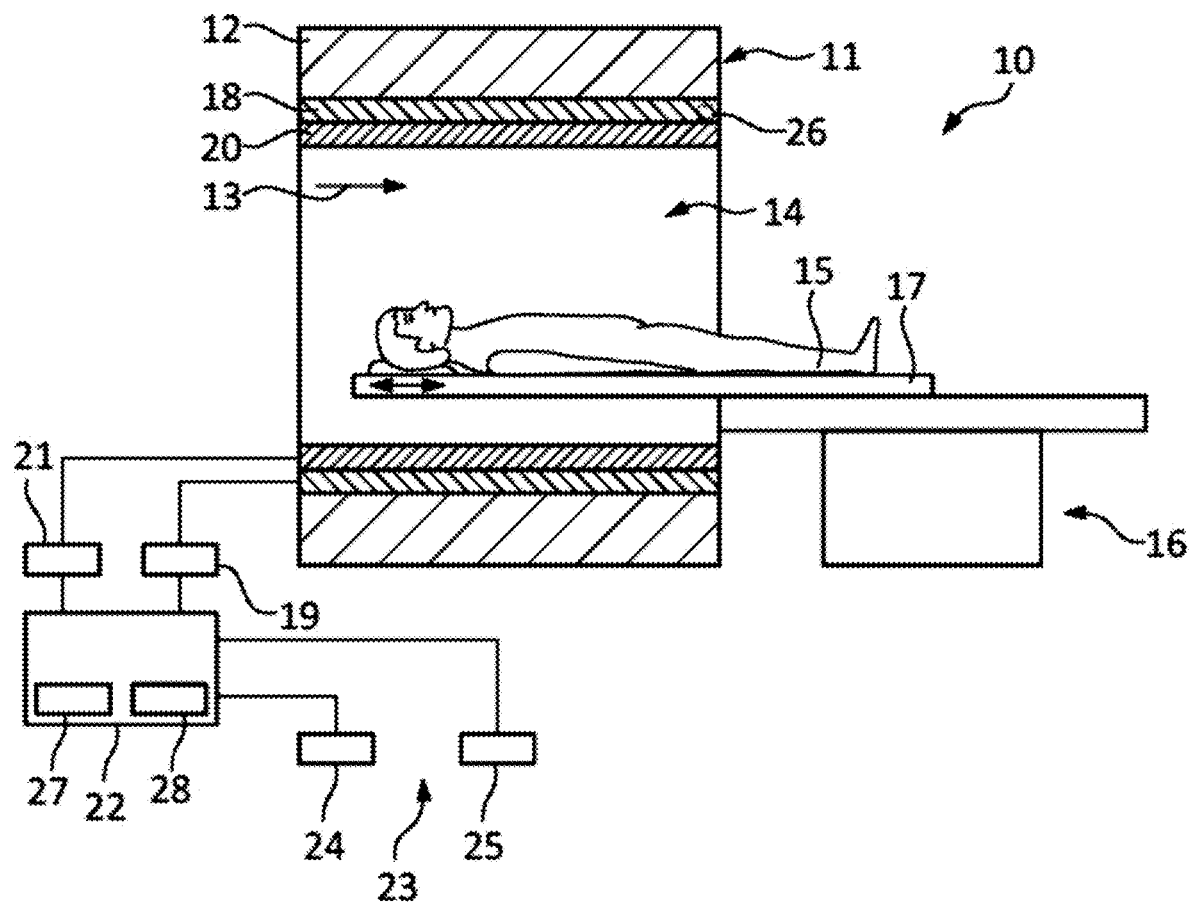
FIG. 1 depicts an example of a magnetic resonance device in a schematic diagram.

FIG. 1 depicts an example of magnetic resonance device 10. The magnetic resonance device 10 includes a magnetic unit 11, which may include a superconducting, main magnet 12 for generating a strong main magnet field, which is, in particular, constant over time. The magnetic resonance device 10 includes a patient-receiving region 14 for receiving a patient 15. The patient-receiving region 14 may be cylindrical and cylindrically surrounded in a circumferential direction by the magnetic unit 11. A different design of the patient-receiving region 14 is also conceivable.

The patient 15 may be moved by a patient-positioning device 16 of the magnetic resonance device 10 into the patient-receiving region 14. The patient-positioning device 16 may include an examination table 17 configured to be moved inside the patient-receiving region 14.

The magnetic unit 11 has at least one gradient coil 18 for generating a gradient magnetic field, which is used for spatial encoding during imaging. Current is configured to be passed through the gradient coil 18 to create the gradient magnetic field. The gradient magnetic field may distort the main magnetic field in a predictable pattern, which may cause a resonance frequency of protons to vary as a function of position along a direction of the gradient. In other words, the application of a gradient may cause a frequency variation of protons as a function of position along the direction of the gradient. These changes in frequency may be used for spatial encoding of a MR signal.

In certain examples, the magnetic unit includes at least three gradient coils, one gradient coil for each axis (e.g., a first gradient coil for the x-axis, a second gradient coil for the y-axis, and a third gradient coil for the z-axis). The magnetic unit 11 may also include at least one temperature sensor 26 associated with each gradient coil. The respective temperature sensor 26 is configured to monitor the temperature of the respective gradient coil 18. The temperature sensors 26 are advantageous in avoiding extreme or undesirable operating conditions for the MR device. That is, the MR device may be shutdown or imaging of a patient 15 may be delayed when a temperature sensor observes a high temperature outside of a programmed operating range (e.g., greater than 60° C. or greater than 80° C.) for the MR device 10. Additionally, as will be described in greater detail below, a temperature reading (e.g., just prior or at the time of imaging of the patient 15) from at least one temperature sensor 26 associated with a particular gradient coil 18 may be used in the calculation and development of a pre-emphasis gradient for the particular gradient coil 18 for the imaging of the patient 15.

The gradient magnetic field and the main magnet field are overlaid to form an applied magnetic field $B_0$. The at least one gradient coil 18 is controlled by a gradient control unit 19 of the magnetic resonance device 10.

The magnetic unit 11 includes a radio frequency (RF) transmitting antenna 2, which may be a body coil permanently integrated in the magnetic resonance device 10. The RF transmitting antenna 20 is designed for excitation of nuclear spins which are established in the applied magnetic field $B_0$.

The RF transmitting antenna 20 is controlled by a RF antenna control unit 21 of the magnetic resonance device 10 in that transmission signals are transmitted by the RF antenna control unit 21 to the RF transmitting antenna 20. By the transmission signals, RF pulses are generated by the RF transmitting antenna 20, and the RF pulses are irradiated into an examination space formed by a patient-receiving region 14 of the magnetic resonance device 10. The irradiated RF pulses cause a magnetic alternating field, which may also be called a $B_1$ field, in the patient-receiving region 14.

The RF transmitting antenna 20 and/or the RF antenna control unit 21 are therefore parts of a transmitting system of the magnetic resonance device 10, which have a transmission characteristic dependent on the frequency of the RF pulses. The RF transmitting antenna 20 may also be designed for receiving magnetic resonance signals.

The magnetic resonance device 10 has a system control unit 22 for controlling the main magnet 12, the gradient control unit 19, and the RF antenna control unit 21. The system control unit 22 centrally controls the magnetic resonance device 10, such as carrying out a predetermined imaging pulse sequence. The system control unit 22 may include at least one processor 27 and at least one non-transitory memory or database 28. As described in greater detail below with the associated methods, the processor 27 may be configured to measure a behavior (e.g., signal strength) of the MR device for the at least one gradient coil at different frequencies at a target temperature and develop at least one gradient system characterization functions for the MR device 10. The at least one characterization function may be stored in the database 28 of the system control unit 22 or in a separate memory or database of a connected device or system. In certain examples, as described in greater detail below, the at least one characterization function includes a plurality of characterization functions for a plurality of target temperatures for each gradient coil of the plurality of coils, and the plurality of target temperatures may be predetermined by the operating temperature range of the particular MR device.

The system control unit 22 or a processor 27 of the system control unit 22 may be configured to monitor or measure an operating temperature of at least one gradient coil of the plurality of gradient coils, receive from a database or determine a gradient system characterization function for the at least one gradient coil based on the measured operating temperature of the respective gradient coil and the at least one characterization function of the respective gradient coil stored in the database (e.g., the characterization function may be provided from an external processor or device and stored in a database, such as by the vendor during calibration of the MR device), calculate a pre-emphasized gradient for the at least one gradient coil using the determined gradient system characterization function, and image the patient using the pre-emphasized gradient. As described in greater detail below, the determining of the gradient system characterization function by the control unit may include modeling the gradient system characterization function using the at least one stored characterization function and any temperature difference between the measured operating temperature of the respective gradient coil and the target temperature of a respective stored characterization function.

In addition, the system control unit 22 may be configured to evaluate medical image data acquired during the magnetic resonance examination. Following imaging of a patient 15, the system control unit 22 or a processor 27 of the system control unit 22 may be configured to reconstruct an image of the patient. As noted herein, the reconstructed image may advantageously include a reduced number of artifacts in comparison to a MR image acquisition by a MR device without use of the pre-emphasized gradient in the imaging.

Furthermore, the magnetic resonance device 10 includes a user interface 23, which is connected to the system control unit 22. Control information, (e.g., imaging parameters), and reconstructed magnetic resonance images may be displayed on a display unit 24, (e.g., on at least one monitor), of the user interface 23 for medical staff. The user interface 23 also has an input unit 25 by which the medical staff may input information and/or parameters during a scanning process.

Figure 2:
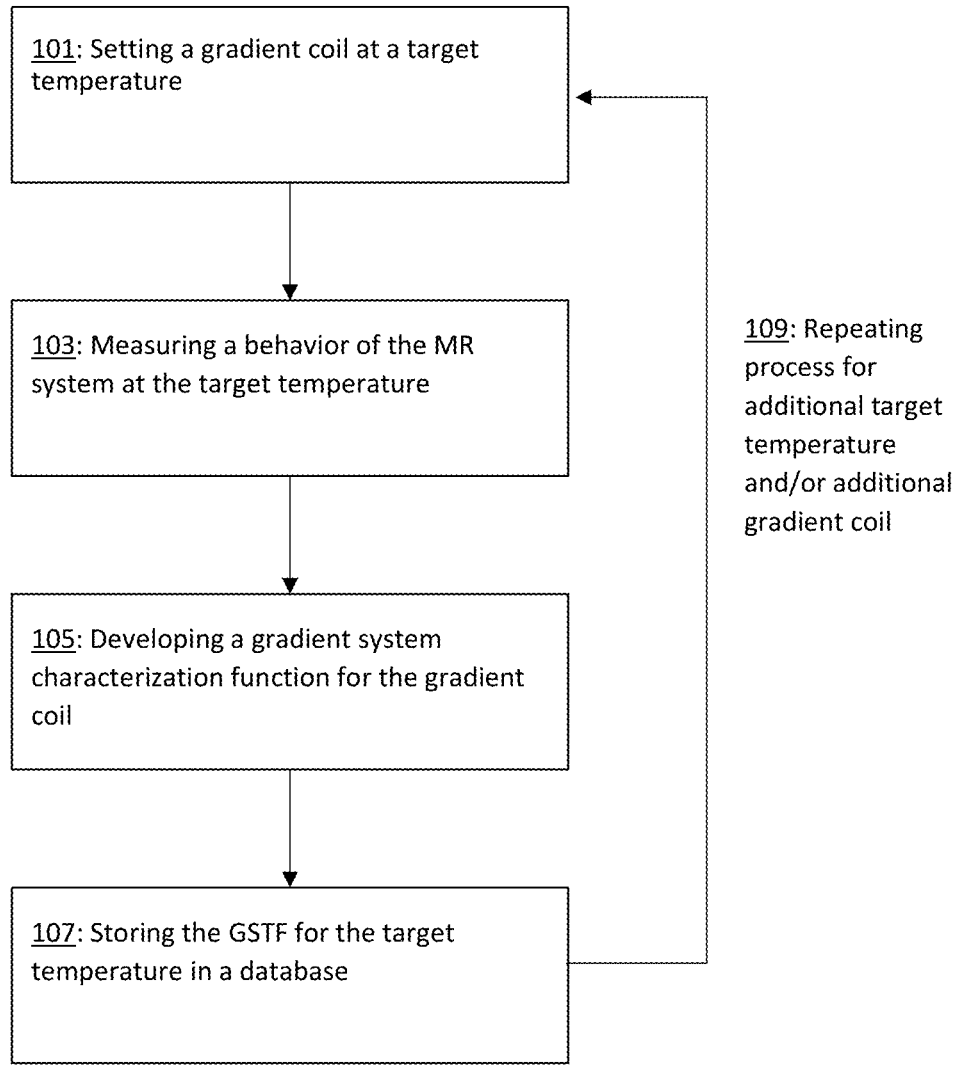
FIG. 2 depicts a block diagram of an exemplary method for determining a gradient system characterization function of a MR device for at least one target temperature.

FIG. 2 depicts a block diagram of an exemplary method for determining a gradient system characterization function of a MR device for at least one target temperature. The process involves understanding how the gradient coils for a particular MR device operate at different temperatures. This initialization process may be performed prior to patient imaging. In certain examples, the initialization or calibration process may be performed when the MR device is initially installed or set up. Alternatively, the initialization process may be performed at regularly scheduled intervals to identify how the gradient coils perform at specific temperatures.

As depicted in FIG. 2, in act 101, the initialization or calibration process may include setting a gradient coil at a target temperature. In some examples, the setting of the temperature may include identifying the ambient room temperature conditions as a first target temperature (e.g., a "cold" operating state of the MR device). In other words, the ambient room temperature (e.g., 15° C., 20° C., or 25° C.) may be set as a target temperature for understanding how the MR device may operate at a beginning of an operating day, before the gradient coils and MR device have been heated up during usage.

In other examples, a target temperature may be set for a gradient coil that is above the ambient room temperature operating conditions to account for how the MR device performs during usage. The gradient coil may be heated to a target temperature by running electric current through the coil.

One or more temperature sensors associated with the gradient coil may monitor the temperature and determine when a target temperature has been reached. To the extent a plurality of temperature sensors is associated with or measures the temperature of a gradient coil, the operating temperature of the gradient coil may be determined or calculated through any number of methods. In one approach, the maximum temperature measured by a single temperature sensor of the plurality of temperature sensors may identify the operating temperature of the gradient coil. In another approach, an average of the plurality of temperature sensors (or a selected number of sensors) may be used to identify the operating temperature of the gradient coil. In some examples, the average may be a weighted average, wherein a higher or lower weight may be attributed to a specific sensor based on its positioning in the MR device. In yet other examples, any known or later developed modeling approach may be implemented to calculate the operating temperature of a gradient coil using a plurality of temperature sensors associated with the gradient coil.

In act 103, the behavior of the gradient coil of the MR device at the target temperature may be observed. The behavior may include the determination of k-space trajectory characteristics such as delays and geometrical distortions between intended and real gradient output at the target temperature to identify how the system will operate during a patient imaging procedure. In some examples, eddy currents effects, anisotropic gradient amplifier delays, and/or other hardware imperfections of the magnetic resonance system may be monitored at the target temperature. In certain examples, instead of directly measuring k-space trajectory, characteristics of the gradient system can be measured. One approach would be to determine a gradient impulse response function (GIRF) or its Fourier transform, a gradient system transfer function (GSTF). For example, the strength of a measured magnetic resonance signal ("signal strength") may be measured across an operating frequency range of the gradient coil. Different frequencies of the gradient coil may be produced and measured by varying the amount of current to the gradient coil.

In certain examples, the MR device may measure and process the magnetic resonance signals generated by the gradient coil using one or more of the components depicted in FIG. 1 (e.g., the gradient coils, gradient control unit, and at least one processor of the system control unit).

In act 105 of FIG. 2, a gradient system characterization function may be developed from this observation or measured behavior at the target temperature of the gradient coil. The characterization function may be any observed or measured behavior that may affect the k-space trajectory of the magnetic resonance system. The characterization function may be for a specific frequency or within a certain frequency range (e.g., up to 20 kHz). In some examples, the characterization function may include a representation in the time domain.

In some examples, the characterization function may be based on monitoring or measuring eddy currents effects, anisotropic gradient amplifier delays, and/or other hardware imperfections of the magnetic resonance system as a function of temperature.

In certain examples, the characterization function is a gradient system transfer function (GSTF). In one example, the GSTF may include plotting an absolute magnitude response of the signal strength as a function of the operating frequency range. The signal strength may refer to the measured magnetic resonance signal by the one or more receiving coils of the MR device. As noted above, the frequency of the gradient coil may be varied through the amount of current provided to the gradient coil. The magnitude of the GSTF may be plotted a function of the ratio between the measured output gradient strength and the nominal input gradient strength for different operating frequencies of the gradient coil.

The characterization function or GSTF may be developed for any field term order (e.g., zeroth order, first order, second order, third order, other higher order terms, or combinations thereof). In some examples, the characterization function or GSTF is based on a spherical harmonic relationship, as depicted below in Table 1.

TABLE 1

| Number | Spherical Harmonic | Order |
|---|---|---|
| 0 | 1 | 0 |
| 1 | x | 1 |
| 2 | y | |
| 3 | z | |
| 4 | xy | 2 |
| 5 | zy | |
| 6 | $2z^2 - (x^2 + y^2)$ | |
| 7 | xz | |
| 8 | $x^2 - y^2$ | |
| 9 | $3yz^2 - y^3$ | 3 |
| 10 | xyz | |
| 11 | $5yz^2 - y(x^2 + y^2 + z^2)$ | |
| 12 | $2z^3 - 3z(x^2 + y^2)$ | |
| 13 | $5xz^2 - x(x^2 + y^2 + z^2)$ | |
| 14 | $z(x^2 - y^2)$ | |
| 15 | $x^3 - 3xy^2$ | |

Figure 3:
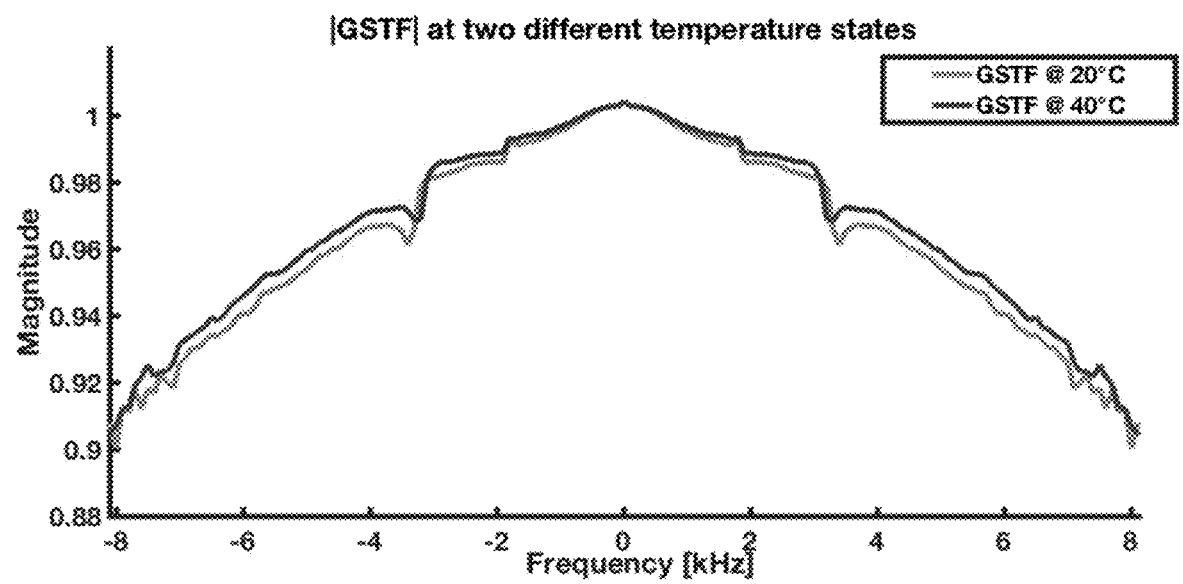
FIG. 3 depicts an example of temperature data from a daily clinical routine of a MR device for a plurality of temperature sensors for various gradient coils.

FIG. 3 depicts an example of such a first order term of a gradient system transfer function, wherein the absolute magnitude of the measured signal strength of the measured magnetic field is plotted as a function of frequency for a frequency range between −8 and 8 kHz (plotted as a deviation from the center frequency) for a gradient coil at two different target temperatures (20° C. and 40° C.). As observed in FIG. 3, the gradient coil behaves differently for different operating temperatures, particularly at frequencies farther from the center frequency. Specifically, FIG. 3 depicts changes in the transmission ratio for a frequency spectrum and shows that the frequency transmission is strongly dependent on the temperature of the gradient system. Consequently, this temperature-dependency has been considered for a pre-emphasis approach disclosed herein.

In act 107 of FIG. 2, the developed gradient system characterization function terms for a particular target temperature of a gradient coil may be stored in a database or non-transitory memory for potential future use during patient imaging. In certain examples, the database or memory may be part of a MR device (e.g., as depicted in FIG. 1), or may be separate from the MR device, but in communication with the MR device via a connected network system. For example, the database or memory may be part of a central storage or database that is affiliated with one or more imaging devices or systems on a connected network.

As noted above, the MR device may include a plurality of gradient coils (e.g., at least one for each axis). Additionally, as noted above, the gradient coils may operate at different temperatures over the course of an operating cycle. As such, the process of understanding a behavior of a gradient coil and developing a characterization function may be performed for each gradient coil at a plurality of temperatures.

In act 109, the process of setting a gradient coil at a target temperature, measuring a behavior, developing the characterization function, and storing the characterization function may be repeated one or more times for each gradient coil to provide an accurate understanding of the operating conditions of the MR device (e.g., how each gradient coil temperature through an operating temperature range may affect the imaging of the MR device).

The number of target temperatures chosen for this process is variable or configurable for each individual MR device. In certain examples, at least two temperatures may be set for each gradient coil in order to develop at least two characterization functions for each gradient coil. For example, the cold or ambient room temperature and a maximum operating temperature or maximum working temperature of a gradient coil may be chosen as the target temperatures to provide bookends for the temperature range. The maximum working temperature may be defined by a programmed automatic shutoff temperature for the MR device (e.g., 80° C. or 85° C.). Alternatively, the maximum expected operating temperature may be based on an expected maximum temperature to operate the MR device (e.g., 40° C. or 45° C.). This maximum operating temperature is less than the programmed cutoff or working temperature for the MR device.

Figure 4:
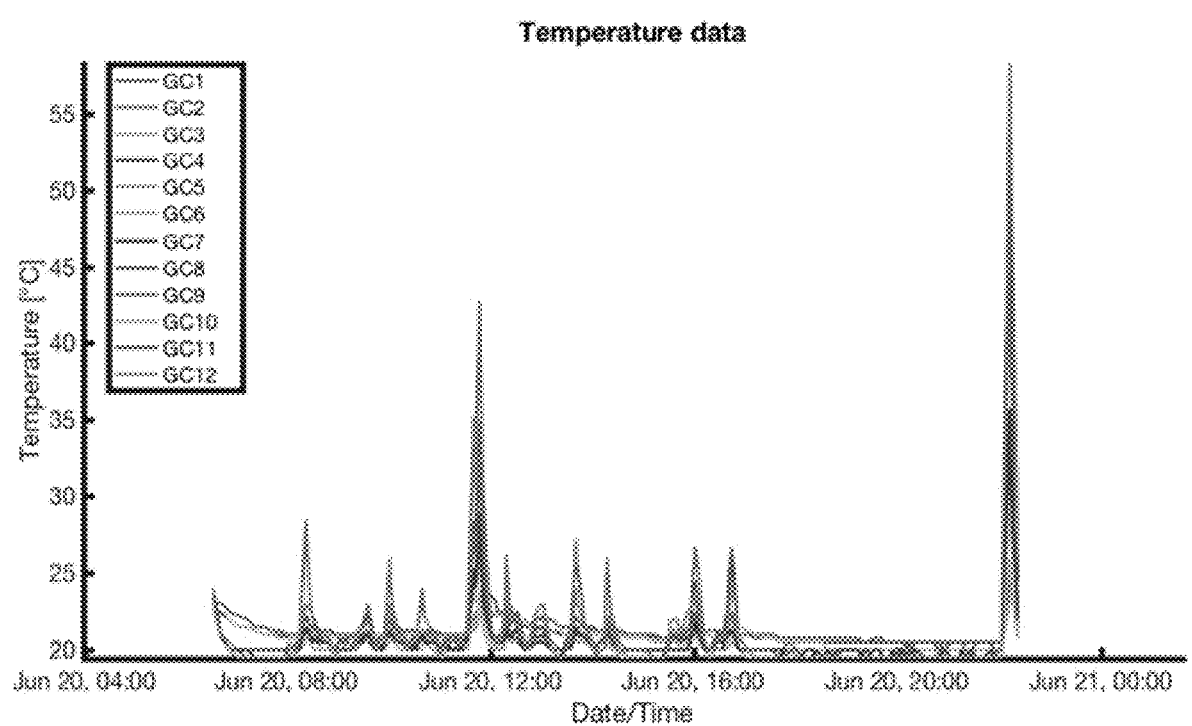
FIG. 4 depicts an example of a magnitude of a gradient system transfer function (GSTF) as a function of frequency for a gradient coil at two different target temperatures (20° C. and 40° C.). The magnitude of the GSTF is a function of the ratio between the measured output gradient strength (e.g., the measured signal strength of the received MR signal) and the nominal input gradient strength (e.g., the input signal strength) for different operating frequencies of the gradient coil.

For example, FIG. 4 depicts an example of measured operating temperatures for a plurality of temperature sensors for gradient coils of a MR device over the course of a daily clinic routine or operating cycle. The observed temperatures range between 20° C. and 55-60° C. As such, the target temperatures for development of the transfer function for each coil may be set at 20° C. and 55° C. or 60° C.

In other examples, a transfer function may be developed for each gradient coil at predefined temperature intervals, such as every 5° C. or every 10° C. for the operating range of the MR device (e.g., at 20° C., 30° C., and 40° C.).

In certain examples, the number of target temperatures may depend on the stability or variability of a specific MR device and the order of the specific GSTF term. For instance, one particular MR device may identify large variability for gradient coils in a temperature range between 20-40° C., while a separate MR device may identify more stability within the same temperature range. Also, one specific GSTF term may identify large variability for gradient coils in a temperature range between 20-40° C., while a another GSTF term may show more stability within the same temperature range. As such, the MR device having greater variability may require a larger number of target temperatures to be observed to provide a similar level of patient imaging accuracy as the MR device with greater stability across the operating temperature range.

Following determining the gradient system characterization (e.g., transfer) functions for at least one gradient coil at one or more target temperatures, an imaging procedure may commence, wherein the gradient system transfer functions may be applied in a multi-field order pre-emphasis correction for the gradient for the patient imaging.

Figure 5:
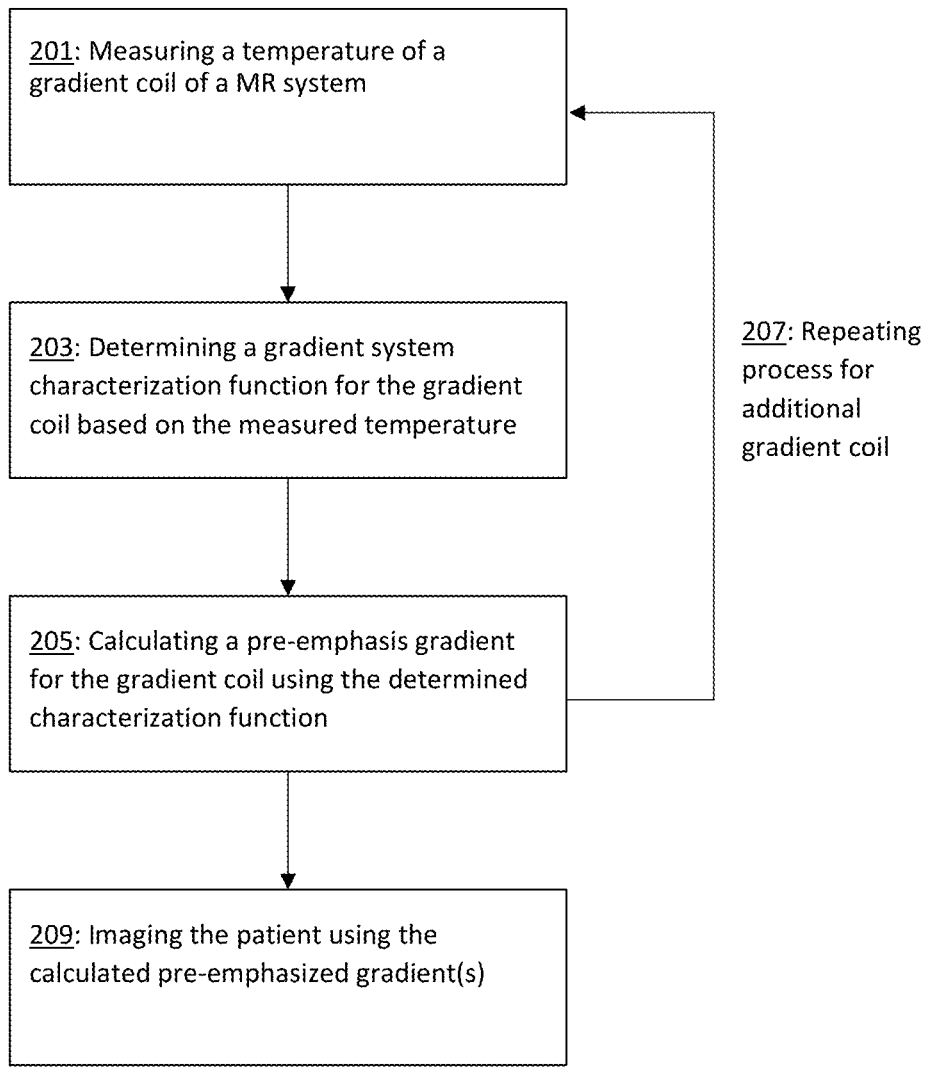
FIG. 5 depicts a block diagram of an exemplary method for imaging a patient based on a calculated pre-emphasis gradient using a determined gradient system characterization function at a measured temperature.

FIG. 5 depicts a block diagram of an exemplary method for imaging a patient based on a multi-field order pre-emphasis gradient to pre-distort a gradient waveform using a determined gradient system transfer function at a measured temperature.

In act 201, a temperature of at least one gradient coil is measured. The temperature may be measured within a certain time window at the time the patient is imaged (e.g., within 1 minute of imaging, within 5 minutes of imaging, within 10 minutes of imaging, and so on). This is advantageous in understanding the current temperature conditions of the gradient coils used in the imaging and potentially adjusting or applying a pre-emphasis gradient adjustment based on the approximate temperature at the time of imaging.

As noted above, one or more temperature sensors may be associated with the gradient coil. To the extent a plurality of temperature sensors is associated with or measures the temperature of a gradient coil, the measured temperature of the gradient coil may be determined or calculated through any number of methods discussed above. In one approach, the maximum temperature measured by a single temperature sensor of the plurality of temperature sensors may identify the operating temperature of the gradient coil. In another approach, an average of the plurality of temperature sensors (or a selected number of sensors) may be used to identify the operating temperature of the gradient coil. In some examples, the average may be a weighted average, wherein a higher or lower weight may be attributed to a specific sensor based on its positioning in the MR device. In yet other examples, any known or later developed modeling approach may be implemented to calculate the operating temperature of a gradient coil using a plurality of temperature sensors associated with the gradient coil.

In act 203, a gradient system characterization (e.g., transfer) function may be determined for the gradient coil based on the measured temperature of the gradient coil at or before the time of imaging. In certain examples, the method includes retrieving (e.g., using a processor of the MR device) from a database, at least one stored characterization (e.g., transfer) function for the respective gradient coil, where each stored characterization function is based on a measured behavior of the MR device at a target temperature at different frequencies (as discussed above for the example procedure in FIG. 2). The characterization function for a specific temperature state may be determined based on a comparison between the measured temperature and the retrieved characterization function(s) from the database.

The determination of the characterization function for the gradient coil may include selecting a previously determined characterization function based on the closest target temperature transfer function stored in the database. For instance, the measured gradient coil temperature may match or be within a certain range of (e.g., within 1° C., within 2° C., or within 5° C.) of a target temperature. In this case, the determined characterization function may be the transfer function that was calculated at the target temperature.

In other examples, the determination of the characterization function for a measured temperature may include some modeling algorithm or method, wherein the gradient system characterization function is determined using the at least one stored characterization function and any temperature difference between the measured temperature of the respective gradient coil and the target temperature of a respective stored characterization function. In other words, one or more retrieved characterization functions from the database at the target temperatures may be modified or adjusted to account for differences between the measured temperature at the time of imaging and the set target temperatures used to develop the database of characterization functions.

In some examples, the modeling may include an interpolation calculation when the measured temperature is between two target temperatures. In other words, the modeling may include interpolating the gradient system characterization function for the measured temperature between a first stored characterization function at a target temperature greater than the measured temperature and a second stored characterization function at a target temperature less than the measured temperature. For example, characterization functions may have been developed for a gradient coil at 20° C. and 40° C. (see, e.g., FIG. 3), and the measured temperature at the time of patient imaging may be at 30° C. The determination of the characterization function for the measured temperature may include an interpolation between these two characterization functions.

In other alternative examples, the modeling may include an extrapolation where the measured temperature is outside of a temperature range of two or more target temperatures. In other words, the modeling may include extrapolating the gradient system characterization function for the measured temperature from at least two stored characterization functions having target temperatures that are either greater than or less than the measured temperature. For example, characterization functions may have been developed for a gradient coil at 20° C. and 40° C. (see, e.g., FIG. 3), and the measured temperature at the time of patient imaging may be at 45° C. The determination of the characterization function for the measured temperature may include an extrapolation to 45° C., using the characterization functions at 20° C. and 40° C.

In act 205, a pre-emphasized gradient for a gradient coil may be calculated using the determined characterization function for the respective gradient coil. As noted above, the pre-emphasized gradient is advantageous in providing a correction to a k-space trajectory to avoid post-processing steps and provide a reconstructed image with a reduced number of artifacts. In some examples, the post-processing steps include using a gradient impulse response function or gradient system transfer function that provide post-correction of distorted trajectories by predicting the trajectory played out by a MR device, and this post-correction is then used in image reconstruction. Such post-processing may be avoided in the present case. Moreover, post-correction techniques during image reconstruction do not work for applications, like special spectral pulses, bSSFP-imaging, and phase imaging.

The pre-emphasized magnetic field components may be calculated for a zeroth order, first order, second order, third order, higher order terms, or combinations thereof. For the $1^{st}$ order field term, the pre-emphasized gradient may be calculated using a (e.g., spiral) nominal, uncorrected gradient waveform for the gradient coil and the determined transfer function for a specific temperature state. For example, for a first order field term involving a gradient being calculated for a single direction (e.g., x, y, or z-axis), the calculation of the pre-emphasized gradient may be represented by the equation below:

$$g_{pre,l}^{T}(t) = \mathcal{F}^{-1}\{G_{nom,l}(f) \cdot GSTF_{l,l}^{T^{-1}}(f)\}$$

wherein:

$g_{pre,l}^{T}(t)$=the pre-emphasized gradient for direction l and Temperature T, $\mathcal{F}$ =Fourier transform, $G_{nom,l}(f)$=nominal uncorrected gradient at frequency f, direction l (for a reference temperature state, e.g. 15° C., 18° C., 20° C.), and $GSTF_{l,l}^{T^{-1}}(f)$=gradient system transfer function at the frequency f and the direction l (for a specific temperature state T).

In act 207, the process of measuring a temperature of a gradient coil, determining a characterization function, and calculating a pre-emphasized gradient may be repeated for one or more additional gradient coils within the MR device. As noted above, the MR device may include a plurality of gradient coils including a first gradient coil for an x-axis, a second gradient coil for a y-axis, and a third gradient coil for a z-axis of the MR device. In such a device, the process of measuring a temperature of a gradient coil, determining the transfer function, and calculating the pre-emphasized gradient may be conducted for the three gradient coils.

The processes described in acts 201, 203, and 205 may be conducted for each gradient coil concurrently, wherein all of the temperatures of the gradient coils are measured at a same time by the plurality of temperature sensors in the MR device. The determining and calculating acts may proceed for each gradient coil at a same time or in sequence.

In act 209, a patient may be imaged by the MR device using the pre-emphasized gradients calculated for the gradient coils. In certain examples, the imaging is performed using a Cartesian (row-by-row) trajectory for filling k-space. Alternatively, the imaging is performed using a non-Cartesian trajectory, such as radial, spiral, zig-zag, or echo-planar imaging acquisition. As noted above, such non-Cartesian acquisitions may have higher demands on temporal accuracy of gradient fields, and a higher chance of deviation from the planned k-space trajectory. The calculated pre-emphasized gradients may correct these deviations. As noted above, the pre-emphasized magnetic field components may be calculated for multi-order terms (e.g., 0, 1, 2, 3, or higher), such as for a spherical harmonic represented in Table 1. These pre-emphasized magnetic field components for these multi-order field terms may be used to correct such deviations.

The imaging of the patient may include the reconstruction of the imaging data collected by the MR device and production of a MR image, which may be stored in the database or displayed on a display unit of the MR device. As noted above, the method disclosed herein is advantageous in providing improved image quality having a reduced number of artifacts. That is, the reconstructed image may include a reduced number of artifacts in comparison to a similar MR image acquisition process with the MR device, but without use of the pre-emphasized gradient in the patient imaging. Further, the method may also avoid post-processing of the imaging data during the reconstruction, which may eliminate signal loss that may occur in post-processing.

Figure 6:
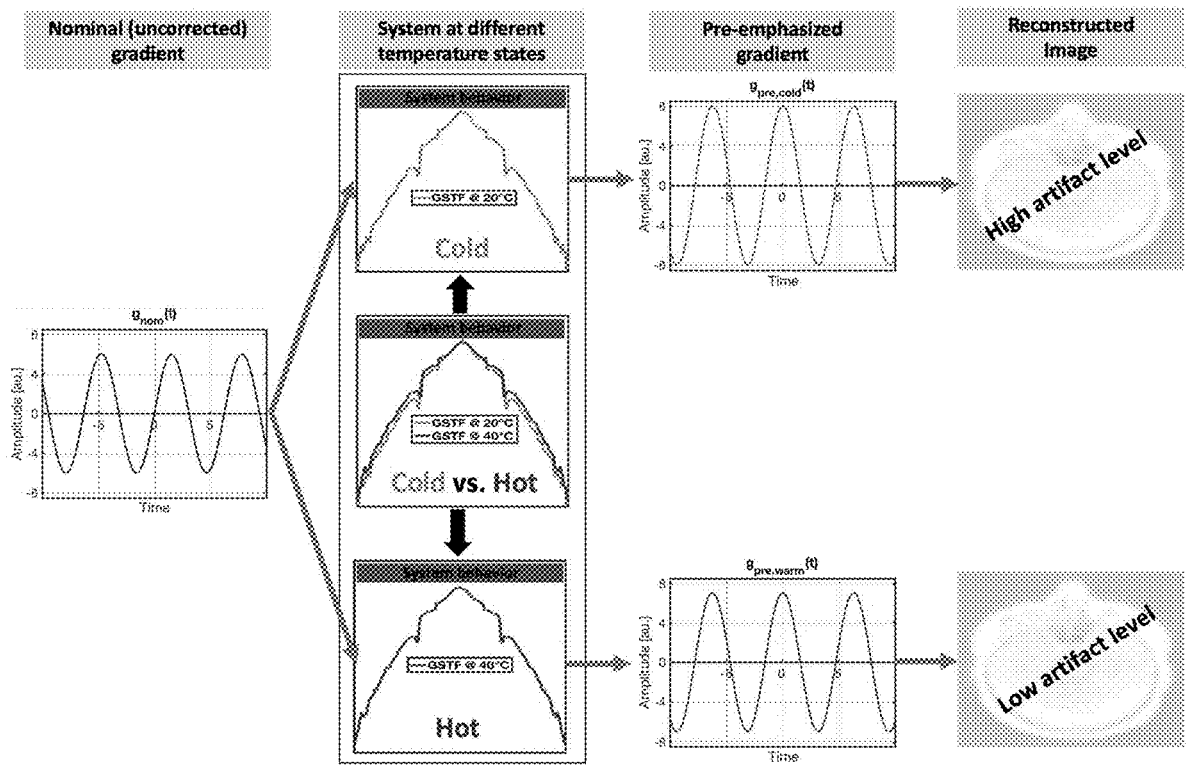
FIG. 6 depicts a schematic visualization of a pre-emphasis correction technique at different temperature states (20° C. and 40° C.) and an image acquisition with a non-Cartesian trajectory (e.g., zig-zag trajectory) performed at 40° C.

FIG. 6 depicts a schematic visualization of a pre-emphasis correction technique based on the methods disclosed herein. The far left-column depicts a nominal, uncorrected sinusoidal gradient waveform for a particular gradient coil. The second column depicts the performance of the gradient coil in the MR system at different temperature states (20° C. and 40° C.). This system behavior or gradient system transfer function was developed through the process discussed above in FIG. 2, wherein a behavior (e.g., the strength of the measured magnetic resonance signal) of the gradient coil at a target temperature was monitored by the MR system, and the gradient system transfer function was developed based on this monitored behavior.

The third column in FIG. 6 depicts the pre-emphasized gradient that is calculated to pre-distort a gradient waveform for the gradient coil when the MR device is preparing to image a patient. This pre-emphasized gradient calculation is conducted based on the process discussed above in FIG. 5, wherein the temperature of the gradient coil is measured prior to the imaging and the nominal gradient is corrected using a correlating gradient system transfer function. As noted in the example in FIG. 6, the image acquisition is performed with a measured gradient coil temperature of 40° C. This measured temperature matches the "hot" system behavior represented by the lower transfer function in the second column.

Finally, in the far-right column, following imaging of the patient using the pre-emphasized gradient (e.g., using a non-Cartesian zig-zag trajectory), the image is reconstructed. In this example, the process shows that a pre-emphasized gradient calculated using the "cold" transfer function for 20° C. leads to a reconstructed image with a high artifact level because the gradient coil was operating at different temperature (e.g., 40° C.). In this example, the process shows that a pre-emphasized gradient calculated using the "hot" transfer function for 40° C. leads to a reconstructed image with a low artifact level because the gradient coil was operating at a similar temperature. In other words, only the hot state system behavior that fits to the temperature of the image acquisition determines the correct pre-emphasized gradient and allows the best image quality.

In other words, FIG. 6 depicts that to diminish image artifacts, the nominal sinusoidal gradient waveforms have to be modified by a pre-emphasis based on the characteristics of the dynamic gradient system before they are played-out. When the system behavior which was measured at room temperature ("cold state", 20° C.) is used to pre-emphasize the gradients, the reconstructed image in the end still suffers from residual artifacts. To determine the correct pre-emphasized input gradient and to achieve optimized image quality, the system behavior for the "hot" temperature state (40° C.) has to be applied for calculating the pre-emphasis.

Figure 7:
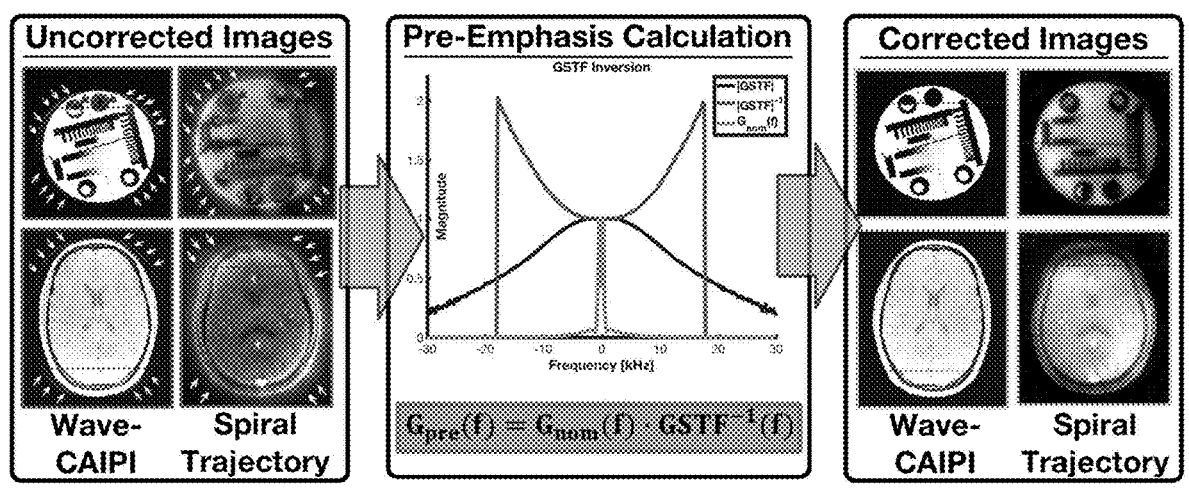
FIG. 7 depicts an example of how a pre-emphasis correction for a k-space trajectory may reduce artifacts and improve overall image quality.

FIG. 7 depicts an example of how a pre-emphasis correction for a trajectory correction may reduce artifacts and improve overall image quality. As depicted in the center column, a gradient system transfer function-based pre-emphasis may be applied, e.g., to non-Cartesian sequences for trajectory correction. Without the correction technique the images may suffer from ghosting-like artifacts (see left column). When applying the gradient system transfer function-based pre-emphasis, the artifact level may be reduced and thus the image quality can be improved (see right column).

It is to be understood that the elements and features recited in the appended claims may be combined in different ways to produce new claims that likewise fall within the scope of the present disclosure. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present disclosure has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A method for developing at least one gradient system characterization function for a magnetic resonance (MR) device, the method comprising:
    setting at least one gradient coil of the MR device at a target temperature;
    measuring a behavior of the MR device at the target temperature at different frequencies of the at least one gradient coil, wherein the different frequencies are generated by varying current through the at least one gradient coil; and
    developing, by a processor of the MR device, at least one gradient system characterization function for the at least one gradient coil of the MR device at the target temperature based on the measured behavior.

2. The method of claim 1, wherein the gradient system characterization function is a gradient system transfer function.

3. The method of claim 2, wherein the gradient system transfer function is developed for a zeroth order, first order, second order, third order field term, or a combination thereof.

4. The method of claim 1, further comprising:
    repeating the setting, the measuring, and the developing for at least one additional target temperature to provide a plurality of gradient system characterization functions for the at least one gradient coil of the MR device at a plurality of target temperatures; and
    storing the plurality of gradient system characterization functions in a database of the MR device.

5. The method of claim 4, wherein the plurality of target temperatures is predetermined by an operating temperature range of the MR device.

6. The method of claim 4, wherein the plurality of gradient system characterization functions is a plurality of gradient system transfer functions,
    wherein the at least one gradient coil comprises a first gradient coil for an x-axis, a second gradient coil for a y-axis, and a third gradient coil for a z-axis of the MR device,
    wherein the behavior of the MR device is measured independently for each gradient coil at each target temperature, and
    wherein a gradient system transfer function is developed for each axis of the MR device at each target temperature of the plurality of target temperatures.

7. The method of claim 1, wherein the setting of the target temperature comprises heating at least one gradient coil by running an electrical current through the at least one gradient coil.

8. The method of claim 1, wherein the target temperature of the MR device is monitored by at least one temperature sensor associated with a respective gradient coil.

9. A method of imaging a patient using a magnetic resonance (MR) device, the method comprising:
    measuring a temperature of at least one gradient coil of the MR device using at least one temperature sensor associated with the respective gradient coil;
    determining, using a processor of the MR device, a gradient system characterization function for the at least one gradient coil based on the measured temperature of the respective gradient coil;
    calculating a pre-emphasized gradient for the at least one gradient coil using the determined gradient system characterization function; and
    imaging the patient using the pre-emphasized gradient.

10. The method of claim 9, wherein the at least one temperature sensor comprises a plurality of temperature sensors, and
    wherein the measured temperature of the respective gradient coil is based on temperature measurements for more than one temperature sensor of the plurality of temperature sensors.

11. The method of claim 9, wherein the determining of the gradient system characterization function comprises:
    retrieving, from a database of the MR device, at least one stored characterization function for the respective gradient coil, each stored characterization function based on a measured behavior of the MR device at a target temperature at different frequencies of the respective gradient coil which has been generated by through a varying of current through the respective gradient coil; and modeling, by the processor, the gradient system characterization function using the at least one stored characterization function and any temperature difference between the measured temperature of the respective gradient coil and the target temperature of a respective stored characterization function.

12. The method of claim 11, wherein the modeling comprises interpolating the gradient system characterization function for the measured temperature between a first stored transfer function at a target temperature greater than the measured temperature and a second stored characterization function at a target temperature less than the measured temperature.

13. The method of claim 11, wherein the modeling comprises extrapolating the gradient system characterization function for the measured temperature from at least two stored characterization functions having target temperatures that are either greater than or less than the measured temperature.

14. The method of claim 9, wherein the at least one gradient coil comprises a plurality of gradient coils including a first gradient coil for an x-axis, a second gradient coil for a y-axis, and a third gradient coil for a z-axis of the MR device,
wherein temperatures are measured for each gradient coil of the plurality of gradient coils,
wherein gradient system characterization functions are determined for each gradient coil of the plurality of gradient coils,
wherein pre-emphasized gradients are calculated for each gradient coil of the plurality of gradient coils, and
wherein the patient is imaged using the pre-emphasized gradients for the plurality of gradient coils.

15. The method of claim 9, wherein the gradient system characterization function is a gradient system transfer function.

16. The method of claim 15, wherein the pre-emphasized gradient is a first order magnetic field term calculated using the following formula:

$$g_{pre,1}^{T}(t) = \mathcal{F}^{-1}\{G_{nom,1}(f) \cdot GSTF_{1,1}^{T^{-1}}(f)\}$$

wherein:
$g_{pre,1}^{T}(t)$=the pre-emphasized gradient for direction 1 and Temperature T,
$\mathcal{F}$ =Fourier transform,
$G_{nom,1}(f)$=nominal uncorrected gradient at frequency f, direction 1 (for a reference temperature state, and
$GSTF_{1,1}^{T^{-1}}(f)$=gradient system transfer function at the frequency f and the direction 1 (for a specific temperature state T).

17. The method of claim 9, further comprising:
reconstructing an image of the patient, wherein the reconstructed image comprises a reduced number of artifacts in comparison to a MR image acquisition process without use of the pre-emphasized gradient in the imaging.

18. A magnetic resonance (MR) device comprising:
a plurality of gradient coils having a first gradient coil for an x-axis, a second gradient coil for a y-axis, and a third gradient coil for a z-axis of the MR device;
at least one temperature sensor for each gradient coil of the plurality of gradient coils, the at least one temperature sensor configured to monitor a temperature of the respective gradient coil;
at least one processor configured to set at least one gradient coil to a target temperature, measure a behavior of the MR device for the at least one gradient coil at different frequencies generated by varying current through the at least one gradient coil, and develop at least one characterization function for the at least one gradient coil at the target temperature based on the measured behavior; and
a database or non-transitory memory configured to store the at least one characterization function of the at least one gradient coil of the plurality of gradient coils.

19. The MR device of claim 18, wherein the characterization function is a transfer function.

20. The MR device of claim 18, wherein the at least one characterization function comprises a plurality of characterization functions for a plurality of target temperatures for each gradient coil of the plurality of gradient coils, and
wherein the plurality of target temperatures is predetermined by an operating temperature range of the MR device.

21. The MR device of claim 18, wherein the at least one processor is further configured to:
measure an operating temperature of at least one gradient coil of the plurality of gradient coils;
determine a gradient system characterization function for the at least one gradient coil based on the measured operating temperature of the respective gradient coil and the at least one characterization function of the respective gradient coil stored in the database;
calculate a pre-emphasized gradient for the at least one gradient coil using the determined gradient system characterization function; and
image a patient using the calculated pre-emphasized gradient.

22. The MR device of claim 21, wherein the gradient system characterization function is a gradient system transfer function.

23. The MR device of claim 21, wherein the determining of the gradient system characterization function comprises modeling the gradient system characterization function using the at least one stored characterization function and any temperature difference between the measured operating temperature of the respective gradient coil and the target temperature of a respective stored characterization function.

24. The MR device of claim 18, wherein the processor is further configured to reconstruct an image of a patient to provide a reconstructed image,
wherein the reconstructed image comprises a reduced number of artifacts in comparison to a MR image acquisition by the MR device without use of pre-emphasized magnetic field components in the imaging.

* * * * *

UNITED STATES PATENT AND TRADEMARK OFFICE
CERTIFICATE OF CORRECTION

PATENT NO. : 11,112,472 B2
APPLICATION NO. : 16/699415
DATED : September 7, 2021
INVENTOR(S) : Gudrun Ruyters et al.

It is certified that error appears in the above-identified patent and that said Letters Patent is hereby corrected as shown below:

In the Claims

Column 15, Line 50:
"direction l (for a reference temperature state, and"

Should be replaced with:
"direction l for a reference temperature state, and"

Signed and Sealed this
Thirtieth Day of November, 2021

Drew Hirshfeld
*Performing the Functions and Duties of the*
*Under Secretary of Commerce for Intellectual Property and*
*Director of the United States Patent and Trademark Office*